US010921271B2

(12) United States Patent
Zaharia et al.

(10) Patent No.: US 10,921,271 B2
(45) Date of Patent: Feb. 16, 2021

(54) MOBILE DETECTOR AND METHOD FOR DETECTING POTENTIALLY EXPLOSIVE SUBSTANCES, EXPLOSIVES AND DRUGS BY NUCLEAR QUADRUPOLE RESONANCE (NQR)

(71) Applicant: MIRA TECHNOLOGIES GROUP S.R.L., Ilfov (RO)

(72) Inventors: Sandel Aurelian Zaharia, Bucharest (RO); Marian Apostol, Magurele (RO); Silviu Ionita, Pitesti (RO); Vasile Gabriel Iana, Stefanesti (RO); Cristian Monea, Pitesti (RO); Laurentiu-Mihai Ionescu, Pitesti (RO); Daniel Constantin Anghel, Pitesti (RO); Madalin Eugen Ilie, Bucharest (RO); Alexandru Florian Varga, Bucharest (RO)

(73) Assignee: MIRA TECHNOLOGIES GROUP S.R.L., Otopeni (RO)

( * ) Notice: Subject to any disclaimer, the term of this patent is extended or adjusted under 35 U.S.C. 154(b) by 219 days.

(21) Appl. No.: 16/302,040

(22) PCT Filed: May 16, 2017

(86) PCT No.: PCT/RO2017/000009
§ 371 (c)(1),
(2) Date: Nov. 15, 2018

(87) PCT Pub. No.: WO2018/124905
PCT Pub. Date: Jul. 5, 2018

(65) Prior Publication Data
US 2020/0182810 A1 Jun. 11, 2020

(30) Foreign Application Priority Data
May 18, 2016 (RO) .............................. a201600350

(51) Int. Cl.
*G01N 24/08* (2006.01)
*G01R 33/44* (2006.01)
*G01V 3/14* (2006.01)

(52) U.S. Cl.
CPC ......... *G01N 24/084* (2013.01); *G01R 33/441* (2013.01); *G01V 3/14* (2013.01)

(58) Field of Classification Search
CPC ....... G01N 24/084; G01R 33/441; G01V 3/14
USPC .................................................. 324/300, 309
See application file for complete search history.

(56) References Cited

U.S. PATENT DOCUMENTS

| 5,206,592 A | 4/1993 | Buess et al. |
| 6,194,898 B1 | 2/2001 | Magnuson et al. |

(Continued)

FOREIGN PATENT DOCUMENTS

| JP | H06222154 A | 8/1994 |
| WO | 2004001454 A1 | 12/2004 |
| WO | 2004109314 A1 | 12/2004 |
| WO | 2016040195 A1 | 3/2016 |

OTHER PUBLICATIONS

Miller, "Nuclear Quadrupole Resonance Detection of Explosives: An Overview", Proc. of Spie, Detection and Sensing of Mines, Explosive Objects and Obscured Targets XVI, 2011, 7 pages.

(Continued)

*Primary Examiner* — Farhana A Hoque
(74) *Attorney, Agent, or Firm* — Gordon Rees Scully Mansukhani LLP; David R. Heckadon

(57) ABSTRACT

System for detecting explosive substances and drugs by nuclear quadrupole resonance having a central processing unit (UC) which connects to a storage, data processing, and interface unit (USPI) provided with a user console (1C) and a with a head (CS1) for scanning explosives/drugs around the legs and a head (CS2) for scanning suspicious objects on the ground or that cannot be moved having a radio process- (Continued)

Schematic illustration of the detector ing system (SPR) which includes a programmable RF signal generator (DDS) which transmits RF pulses to a power amplifier (AP) coupled to an interface for gain control and for the acquisition of the reflected signal level (IAP), a series-parallel tuning circuit (CA) consisting of a flat spiral ferrite-core coil (L) and two variable capacitors (CV1, CV2) driven by two stepper motors (M1, M2) which are controlled by an automatic tuning matching module (WIAA) through control interfaces.

11 Claims, 6 Drawing Sheets

(56) References Cited

U.S. PATENT DOCUMENTS

| | | |
|---|---|---|
| 2008/0094061 A1 | 4/2008 | Laubacher et al. |
| 2009/0310841 A1 | 12/2009 | Biglieri et al. |
| 2011/0193558 A1* | 8/2011 | Crowley .............. G01R 33/441 324/300 |

OTHER PUBLICATIONS

Cardona et al., "Remote Detection of Ammonium Nitrate by Nuclear Quadrupole Resonance Using a Portable System", Applied Magnetic Resonance, vol. 46, No. 3, Jan. 10, 2015, pp. 295-307.
International Searching Authority, International Search Report and Written Opinion for International Application No. PCT/RO2017/000009, dated Sep. 10, 2018, 20 pages.

* cited by examiner

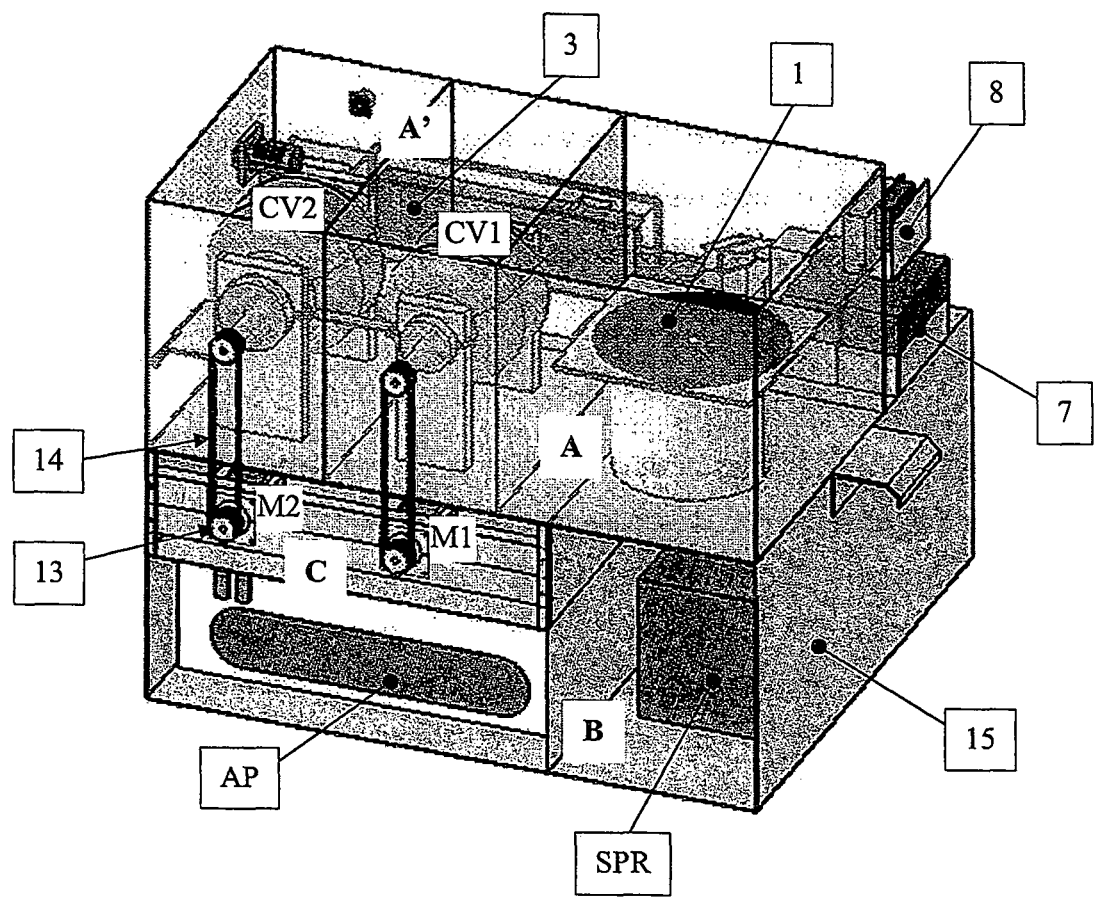
Figure 1. Schematic illustration of the detector

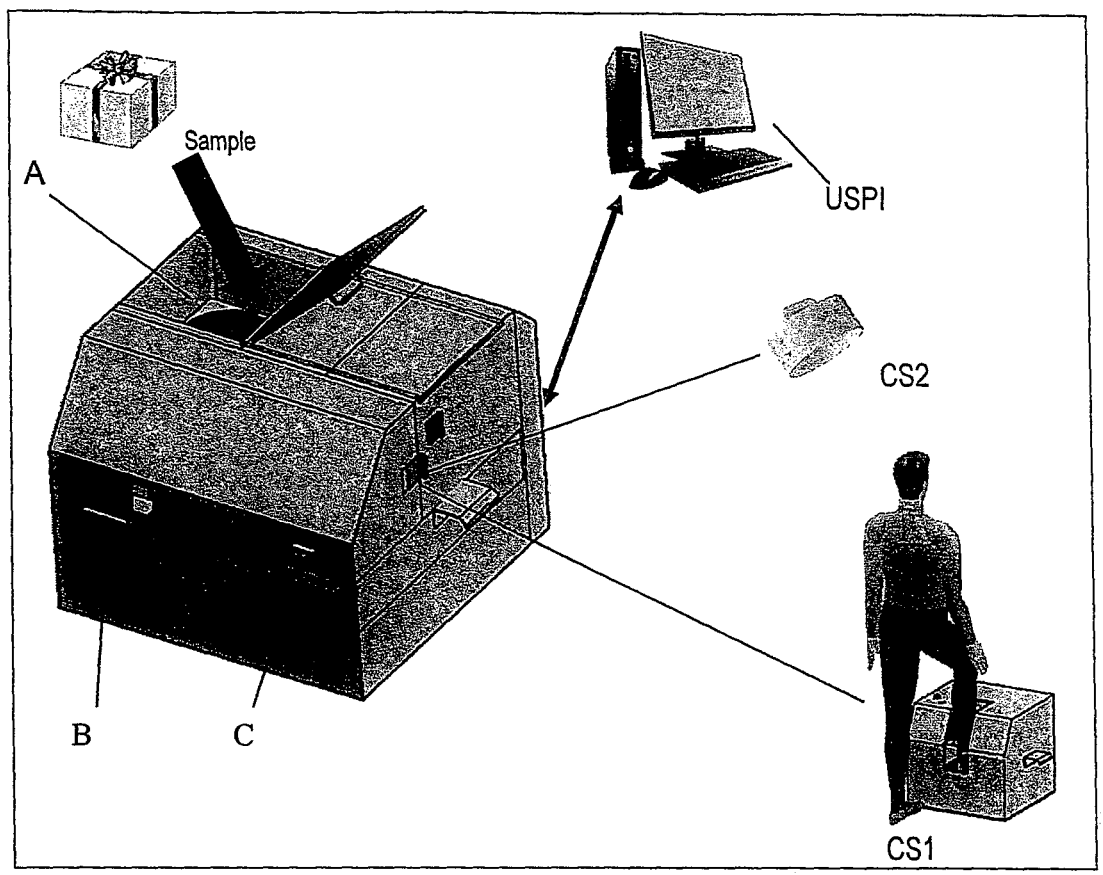
Figure 2. Illustration of the detector

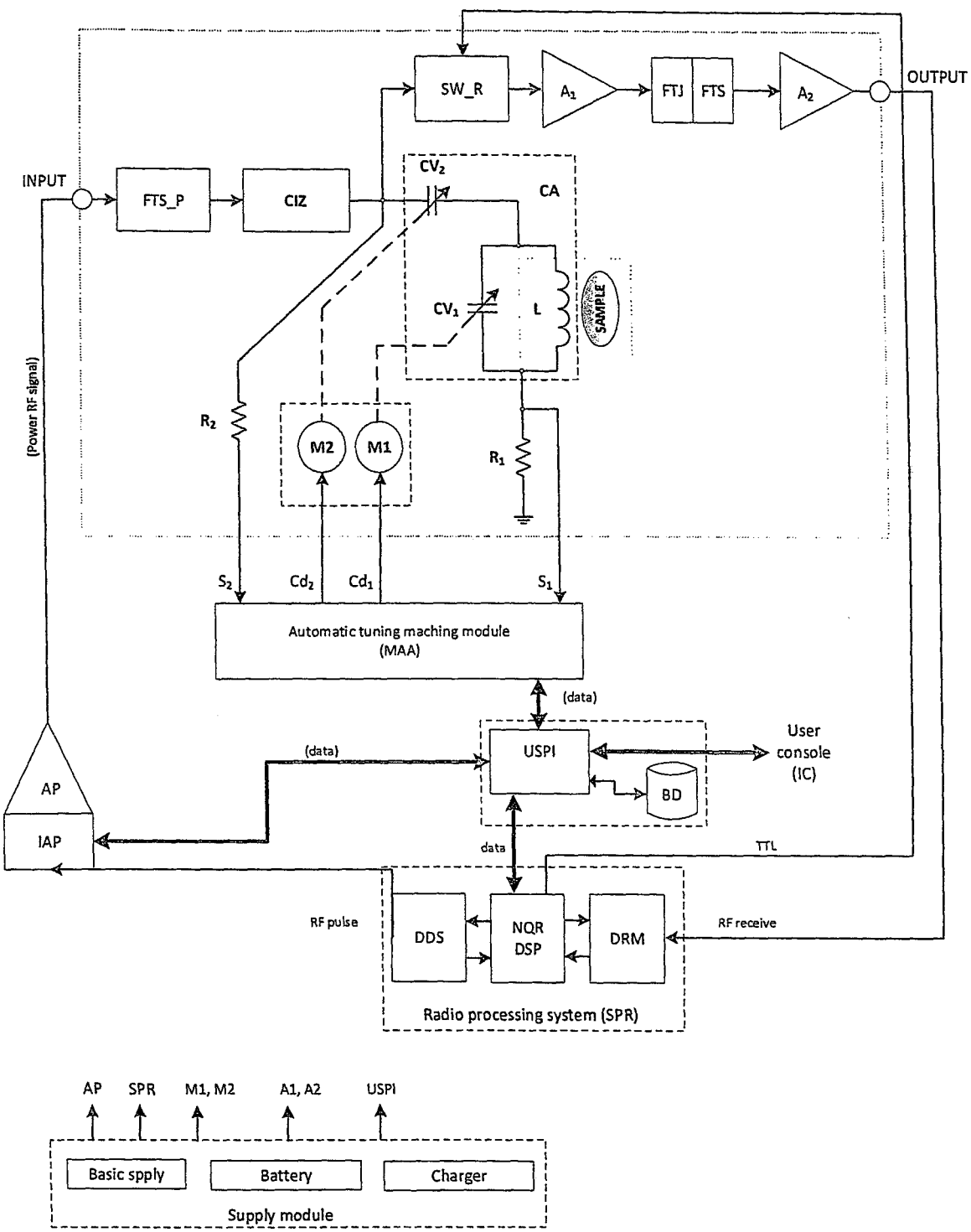
Figure 3. Block diagram of the mobile detector (the central processing unit - UC)

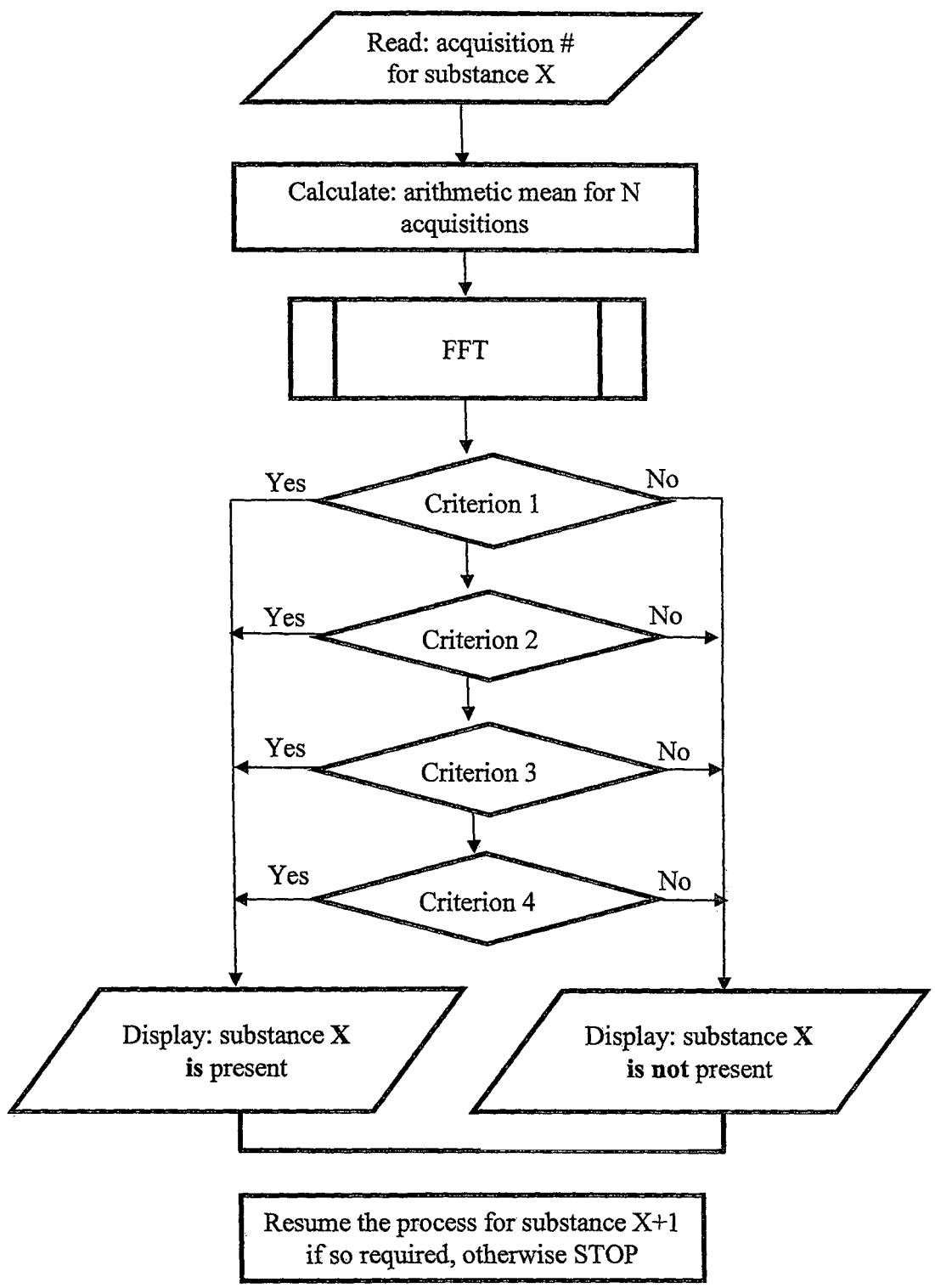
Figure 4. Workflow of the method for detecting potentially explosive substances, explosives and drugs

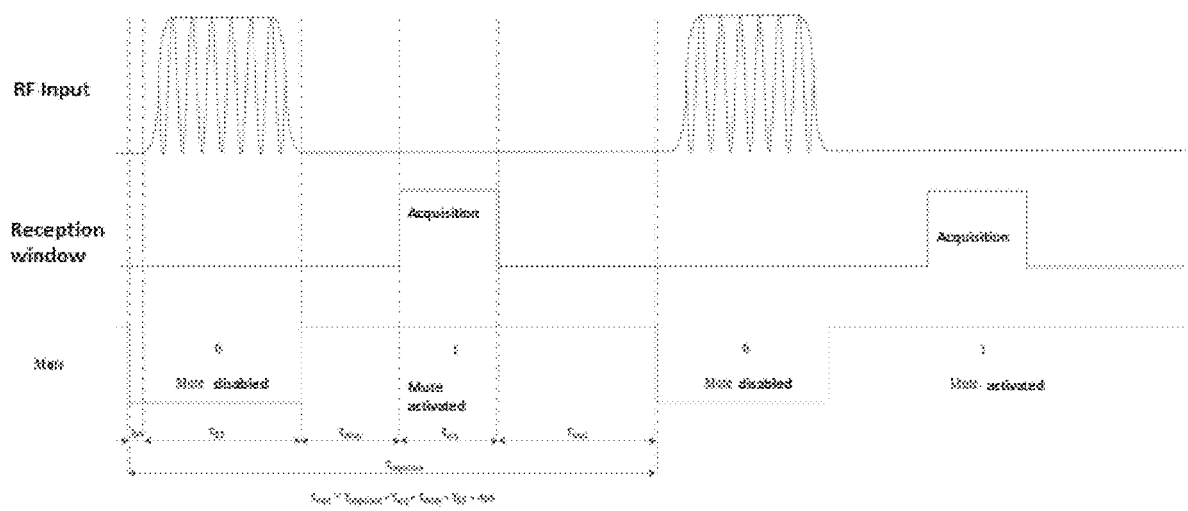
Figure 5. Typical sequence of application of the detection method

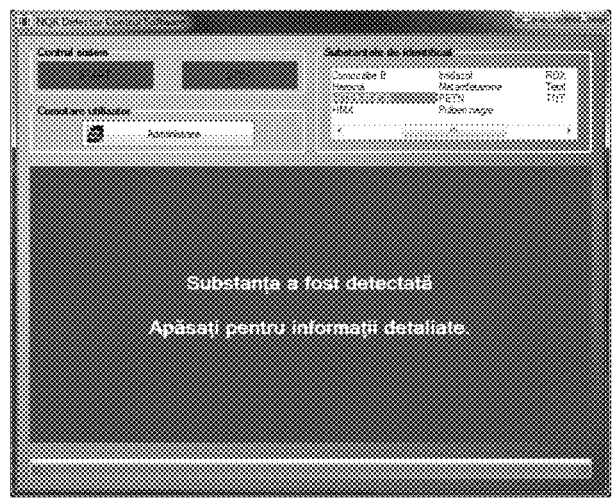
(a) User interface screen in case of positive result
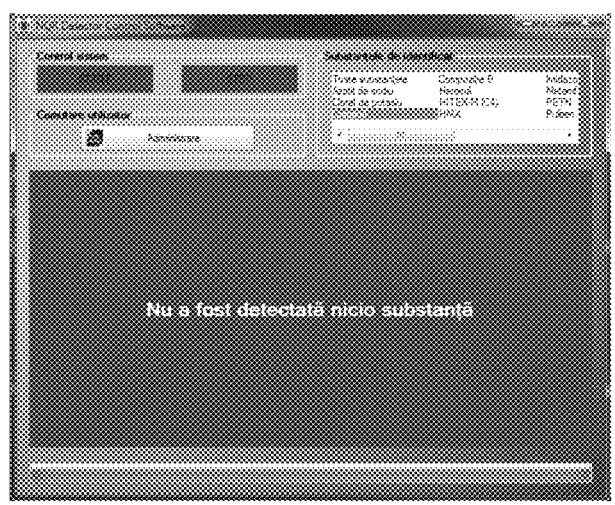
(b) User interface screen in case of negative results
Figure 6. User interface in the Operator operating mode

MOBILE DETECTOR AND METHOD FOR DETECTING POTENTIALLY EXPLOSIVE SUBSTANCES, EXPLOSIVES AND DRUGS BY NUCLEAR QUADRUPOLE RESONANCE (NQR)

CROSS-REFERENCES TO RELATED APPLICATIONS

This application is a United States national phase entry of International Application No. PCT/RO2017/000009, filed on May 16, 2017, which claims the benefit of Romanian Application No. a201600350, filed on May 18, 2016, the entire disclosures of which are incorporated herein by reference in their entireties for all purposes.

The present invention is directed to a mobile detector and a method for detecting potentially explosive substances, explosives and drugs by nuclear quadrupole resonance designed for screening baggage and people at border crossing points in airports, ports, railway stations and in other locations which require strong measures against terrorism and smuggling of prohibited substances such as explosives and drugs.

It is known that the effect of nuclear quadrupole resonance occurs in substances containing mainly nitrogen ($^{14}N$), chlorine ($^{35}Cl$), potassium (K). Nitrogen is present in all explosives and also in some drugs; chlorine is also present in some drugs, while potassium is found in potentially explosive substances. In these substances the effect of nuclear quadrupole resonance occurs exclusively by exciting the nitrogen, chloride, or potassium atoms with radio frequency (RF) fields having the strictly determined frequency specific to each substance and by receiving the response signal (de-excitation of the substance) on exactly the same frequency. The intimate phenomenon of the excitation-de-excitation process of quadrupole nuclei in substances has a quantum origin and was described theoretically and verified experimentally several years ago (1).

There are already known NQR detectors used for detecting explosives and drugs which have the following components: RF pulse generator, power amplifier, inductor-capacitor resonant circuit (LC), low noise amplifier, transmit-receive switching system, signal processing system, scanning results display system, housing for the electromagnetic shielding of the entire system. Their main drawbacks are generally related to the high level of RF power used, which requires expensive and very heavy electromagnetic shielding solutions and thus large overall dimensions. For example, the solution in the Russian patent RU 2247361 (C1) is already known, which features a NQR detector made of: signal reception and processing unit, video cameras, optical information processing device, weight platform, weighing scales, NQR transducer and indicator, transmitting device, damping device, and an NQR transducer circuit tuning device. The person being screened is placed in a double-glazed cabin on the weight platform inside the cabin, whose inner wall is made of dielectric and serves as a screen. The NQR transducer circuit is positioned between the cabin walls.

The already known methods for detecting substances by NQR are based on certain trains of pulses emitted to excite the atomic nuclei, quadrature detection, accumulation and averaging of the response signals received from the substance, followed by the processing of the resulted signal in the frequency domain (using the Fourier transform). The actual identification of a particular target substance is based on comparing the signal amplitude, in the frequency and time domains, with predetermined known levels. A main drawback of the NQR detection methods is related to the significant influence that the actual temperature of the scanned substance has on the NQR specific frequency, as temperature correction of frequency is not generally possible, since it is not possible to measure the exact temperature of the substance which is, usually, inside baggage.

The patent application U.S. Pat. No. 5,233,300A makes known a method and an improved system for detecting explosives and narcotics by nuclear quadrupole resonance (NQR), which is performed at low RF power by recognizing that the strength of the RF field need be greater than the strength of the local magnetic field. This is achieved by means of an adequate coil size.

Another already known solution is that in the International Patent Application WO2011126594 A, which uses microprocessors for controlling the signal generator, but does not correct the scanning frequency with the ambient temperature obtained by measuring the temperature outside the detector and, in addition, by modifying the train of pulses.

The technical problem solved by the invention is the ability to achieve frequency correction with temperature and the automatic tuning on the specific operating frequencies.

The mobile NQR detector for detecting potentially explosive substances, explosives and drugs comprises a housing with reduced overall dimensions, divided in four compartments: the first compartment houses a scanning coil which emits the RF excitation signal and receives a NQR response signal; the second compartment houses several variable capacitors; the third compartment houses a central processing unit; the fourth compartment houses means of reception and power supply, in which
the central processing unit connects to a storage, data processing, and interface unit provided with a user console and a with a head for scanning explosives/drugs around the legs and a head for scanning suspicious objects on the ground or that cannot be moved, and which has a compact build and includes ail the hardware modules and software components necessary for operation, being made up of a radio processing system which includes a programmable RF signal generator which transmits RF pulses to a power amplifier coupled to an interface for gain control and for the acquisition of the reflected signal level, a series-parallel tuning circuit consisting of a flat spiral ferrite-core coil and two variable capacitors driven by two stepper motors which are controlled by an automatic tuning matching module through control interfaces which are, in principle, already known.

According to another aspect of the present invention, the interface for gain control and for the acquisition of the reflected signal level for controlling the RF amplifier is composed of a programmable circuit and a variable attenuator; the interface is controlled by a software application implemented in the storage, processing, and interface unit.

According to another aspect of the present invention, the RF signal supplied by the power amplifier is applied to the tuning circuit through a power filter and a circuit protection.

According to another aspect of the present invention, the central processing unit also contains a transmit-receive switch, a low noise amplifier, a chain of filters and an output amplifier; all these elements acquire the NQR signal representing the substance response, which is brought at optimal parameters for digital processing by means of a digital signal converter and of processing in a control and processing unit.

According to another aspect of the present invention, the storage, data processing, and interface unit consists of a microprocessor-based computer system which is, in principle, already known, running a software application that has the following main functions:
  Processing of data from the radio processing system using the fast Fourier transform (FFT) basic algorithm;
  analysing the frequency spectrum based on four criteria and combining them into the logical filter for discriminating the presence of the target substances;
  managing the substances database and the graphical user interface;
  Controlling the interface for gain control and for the acquisition of the reflected signal level for controlling the RF amplifier;
  Correcting the scanning frequency with ambient temperature by changing pulse parameters, using multiple carrier frequencies ranging between pre-set limits around the given temperature and a longer pulse duration;
  Executing a software application which controls the scanning sequence at the radio processing system.

According to another aspect of the present invention, said housing is an enclosure for shielding against electromagnetic radiation in the 0.4-6 MHz band built on a framework of steel profiles.

The method for detecting potentially explosive substances, explosives and drugs comprises the following steps:
  measuring the ambient temperature with a sensor;
  digitally converting the temperature value and reading it in the software application which controls the radio processing system;
  calculating the NQR frequency by using the coefficient of variation specific to each target substance and transmitting that value ($f_0$) to a programmable RF signal generator;
  ordering, by means of the software application, RF pulses with a certain duration ($\tau_{RF}$) during which the signal frequency will increase in 10 stages within a predetermined range $\Delta f$ around $f_0$, i.e. $f_0 \pm \Delta f/2$;
  identifying the substance by real-time discrimination of the received signal based on a set of four combined criteria applied to the spectral response obtained by means of the fast Fourier transform FFT.

According to another aspect of the present invention, the four criteria are related to the characteristics of the received signal, such as amplitude and the position of the maximum spectral peak, the relative position of any secondary peaks, and the average value, requiring that the positions and amplitudes of the peaks and the average fall within numerical ranges determined depending on the amplitude of the maximum spectral peak.

According to another aspect of the present invention, the following specific values are used to detect RDX and RDX-based explosives:
  basic NQR excitation frequency: $f_0$=3.410 MHz, temperature-corrected; pre-set range for the 10-stage frequency correction: $\Delta f$=2 kHz,
  RF pulse duration: $\tau_{RF}$=130 µs,
  acquisition delay time: $\tau_{delay}$=175 µs,
  acquisition time: $\tau_{acq}$=350 µs,
  time between RF pulses: $\tau_{impulsuri}$=600 µs,
  actual waiting time before the emission of the next pulse is calculated with the formula $\tau_{wait} = \tau_{impulsuri} - \tau_{acq} - \tau_{delay} - \tau_{RF} - 4$ µs,
  number of pulses in the scanning sequence: n=20,
  number of scanning sequences applied: k=100; time between sequences: $\tau_{rep} \geq T_1$, where $T_1$=13 ms.

According to another aspect of the present invention, the storage, data processing, and interface unit requires from the interface of the power amplifier a RF pulse power of 30 W and controls how amplification is interrupted by means of the "Mute" function so that amplification is cut periodically throughout the waiting period $\tau_{wait}$; during the period for data acquisition $\tau_{acq}$, the unit orders a reception window by closing the switch with a signal thus allowing the response signal to be amplified in the target frequency band with an amplification-filtering-amplification chain, resulting in a RF reception signal which enters the processing system through a unit where the radio signal is digitally converted into data.

According to another aspect of the present invention, the data acquired successively according to the detection sequence is averaged to reduce noise and the end result undergoes a process of quadrature demodulation with the separation of the real and imaginary components, as the complex demodulated signal is converted from the time domain to the frequency domain by means of the fast Fourier transform (FFT) algorithm and analysed with the system of four criteria for discriminating the presence of the target substance.

The mobile detector and the detection method according to the present invention have the following advantages:
  The detector can be quickly installed in various places due to its mobility and reduced overall dimensions;
  Lower production and operating costs due inclusively to a lower consumption of power and materials;
  The necessary emission power is reduced due to the technical solutions adopted for the system and method;
  The detection process is automatic for a list of substances selected by the user from the detector's database;
  Frequency correction by measuring-estimating the temperature and the variation of the excitation frequency guarantees an increased probability of detection in real situations;
  The technique proposed for correcting the frequency with temperature allows the valid data (the temperature-frequency pair) related to the target substances to be stored in the detector's database, for future recognition;
  The system of interpretation and decision criteria applied to the NQR response signal for discrimination results in a high probability of detection.

Given below are two embodiments of the present invention, in connection with FIGS. 1-6, which represent:
  FIG. 1—Schematic illustration of the mobile detector for detecting potentially explosive substances, explosives and drugs by nuclear quadrupole resonance (NQR), according to the present invention;
  FIG. 2—Illustration of the mobile detector for potentially explosive substances, explosives and drugs by nuclear quadrupole resonance (NQR), according to the present invention;
  FIG. 3—Block diagram of the central processing unit of the mobile detector for potentially explosive substances, explosives and drugs by nuclear quadrupole resonance (NQR), according to the present invention;
  FIG. 4—Workflow of the method for detecting potentially explosive substances, explosives and drugs by nuclear quadrupole resonance (NQR), according to the present invention;
  FIG. 5—Typical sequence of application of the detection method;
  FIG. 6 a, b—User interface.

The mobile detector for detecting potentially explosive substances, explosives and drugs consists of a housing 15 with reduced overall dimensions with a special partitioning, in which is the central processing unit UC, which connects to a storage, data processing, and interface unit USPI provided with a user console and a head CS1 for scanning explosive substances/drugs around the legs and a head CS2 for scanning suspicious objects on the ground or that cannot be moved.

The housing 15 is an enclosure for shielding against electromagnetic radiation in the 0.4-6 MHz band built on a framework of steel profiles. It is composed of four adjacent compartments: compartment A of the scanning coil 1; adjoining on the same level—another compartment A' of the variable capacitors CV1, and CV2; the third compartment B of the central processing unit UC with the radio processing system SPR; the fourth compartment C which includes a reception system 3, a power amplifier AP, a control interface of the power amplifier IPA, a power supply with rechargeable batteries 7, a charger module 8, two electric motors M1, M2 fitted with a transmission system with gear 13 and belt 14 and a power supply for the motors M1, M2.

Compartment A and compartment A' together form a unitary subassembly with walls made of several layers of different materials. From the inside to the outside the walls are made of a layer of rubber with a thickness of 3 mm, a layer of copper sheet with a thickness of 3 mm, a layer of iron sheet with a thickness of 1.5 mm positioned at a distance of 30 mm of the preceding layer, a layer of rubber with a thickness of 3 mm, a layer of conductive absorbent felt, and a layer of galvanized iron sheet with a thickness of 0.3 mm. The walls of compartments B and C are made of 1.5 mm thick iron sheet with conductive absorbent felt glued on the inside and with the outside covered with alkyd-based paint.

The scanning coil 1 can be interchanged with coils of the same category but with different electrical characteristics for scanning legs or suspicious objects that cannot be moved.

The central processing unit UC is the main part of the detector; it has a compact build and includes all the hardware modules and software components required for the operation of the detector in accordance with the detection method. With reference to. FIG. 3, the unit UC is composed of a radio processing system SPR which includes a programmable RF signal generator DDS which transmits RF pulses to a power amplifier AP coupled to an interface IAP for gain control and for the acquisition of the reflected signal level, a series-parallel tuning circuit CA consisting of a flat spiral ferrite-core coil L and two variable capacitors CV1, CV2 driven by the two stepper motors M1, M2 which are controlled by an automatic tuning matching module MAA through control interfaces which are, in principle, already known. The interface IAP for gain control and for the acquisition of the reflected signal level for controlling the RF amplifier AP is composed of a programmable circuit and a variable attenuator; the interface is controlled by the detector control software residing in the storage, processing, and interface unit USPI. The RF signal supplied by the power amplifier AP is applied to the tuning circuit CA through a power filter FTS-P and a circuit protection CIZ.

The main part which comes into contact with the substance (sample) is the radio-frequency coil L which emits the RF excitation signal and receives an NQR response signal. The parameters of the tuning circuit CA are maintained at optimum values by means of the automatic tuning matching module MAA. The NQR signal representing the response of the substance is acquired through the reception chain consisting of a transmit-receive switch SW-R, a low noise amplifier A1, a chain of filters FTJ-FTS, and an output amplifier A2 and is brought at optimum parameters for the digital conversion by means of the digital signal. converter DRM and through processing in the control and processing unit NQR DSP.

All these functional elements of the UC unit are controlled by the storage, signal processing, and user interface module USPI. This module is remote and connects to a man-machine communication console.

The USPI unit is composed of a microprocessor-based computer system which is, in principle, already known, running a software application that has the following main functions:

Processing of data from the radio processing system SPR by using the fast Fourier transform (FFT) basic algorithm;

analysing the frequency spectrum based on four criteria and combining them into the logical filter FTJ-FTS for discriminating the presence of the target substances;

managing the substances database BD and the graphical user interface; Controlling the interface for gain control and for the acquisition of the reflected signal level IAP for controlling the RF amplifier;

Correcting the scanning frequency with ambient temperature by changing pulse parameters, using multiple carrier frequencies ranging between pre-set limits around the given temperature and a longer pulse duration;

Executing a software application which controls the scanning sequence at the SPR.

It is already known that NQR frequencies vary with the temperature of the substances. Within ranges of a few degrees this variation is typically linear. Generally, each substance has its own coefficient of variation of the NQR frequency with temperature, which is usually negative. To increase the probability of detection, the scanning frequency is automatically corrected with the ambient temperature measured at the location of the baggage and, additionally, by changing the frequency composition and pulse duration. Thus, longer pulses are used, with multiple carrier frequencies ranging between pre-set limits ("coloured" pulses). Finally, the scanned substance is identified by using a system of combined criteria—amplitude-related and spectrum-related—applied to the response signal.

Correction of the operating frequency with temperature is achieved by two methods: (1) measuring the ambient temperature with a sensor, digitally converting the temperature value, reading thereof in the software application which controls the SPR, calculating the NQR frequency by using the variation coefficient specific to each target substance and transmitting that value ($f_0$) to the digital frequency synthesizer DDS, and (2) the software application will order RF pulses with a certain duration ($\tau_{RF}$) during which the signal frequency will increase in 10 stages within a predetermined range $\Delta f$ around $f_0$, i.e. $f_0 \pm \Delta f/2$. The substance is identified by real-time discrimination of the received signal based on a set of four combined criteria applied to the spectral response obtained by the FFT method. The criteria are related to the characteristics of the received signal, such as amplitude and the position of the maximum spectral peak, the relative position of any secondary peaks, and the average value, requiring that the positions and amplitudes of the peaks and the average fall within numerical ranges determined depending on the amplitude of the maximum spectral peak. The identification method consists in distinguishing the spectrum of the received signal from that obtained for a scan in which another substance is present or the substance chosen by the user does not exist, in which case a number of spectral peaks are obtained, with comparable amplitudes, indicating the absence of the chosen target substance. By being related to the characteristics of the received signal and not to pre-established characteristics (stored in the database), the criteria provide flexibility in signal discrimination. These combined criteria have the role of a logical discrimination filter that guarantees a high probability of detection and a very small percentage of false-positive alarms.

The detector's database includes substances that can be detected by NQR, for example, explosive substances/materials (phlegmatized RDX and non-phlegmatized RDX HITEX-M (C4); Composition B; tetryl, potassium nitrate; black powders; ammonium nitrate), drugs and toxic substances (heroin, paracetamol, sodium nitrite). The program which processes the data from the actual detector ensures the automatic detection of the selected substances and is described in FIG. 4.

Scanning results are displayed and the user communicates with the detector through the user console IC by using a graphical interface that allows controlling the detection process, viewing the scanning history, and editing database fields. The graphical interface has three operating modes:
  Operator—this mode is intended for the personnel who use the detection equipment, employing very simple commands to start/stop detection or to select one or more target substances (see FIG. 6 a, b);
  Administrator—allows, in addition to the Operator mode, viewing the scanning history;
  Maintenance—allows, in addition to the Administrator mode, accessing (read/write) all the database tables (this mode is exclusively for the personnel who perform detector maintenance).

The scanning heads CS1 and CS2 used to detect explosives/drugs around the legs and in suspicious objects that cannot be moved connect to the actual detector through a short RF cable. The scanning head for legs CS1 is composed of a flat coil mounted inside a shielded enclosure provided with an access slot for the leg. The scanning head CS2 for suspicious objects that cannot be moved consists of a flat coil placed inside a semi-open shielding enclosure fitted with a handle.

The detection method is based on the generic pulse sequence shown in FIG. 5, which is generated by the central processing unit UC based on data specific to each target substance previously stored in the system database BD. The operating sequence of the system has, in general, the same steps for any substance, but the operating parameters frequency, durations, number of scans required, RF power necessary for excitation, vary from substance to substance. The operation of the detector is fully automatic once the user has selected the target substances. The selected substances are sought in descending order of the excitation frequencies by successively retrieving from the database BD the specific values for the detection parameters. According to an embodiment of the present invention, the detection method uses the following specific values for the detection of RDX and RDX-based explosives: basic NQR excitation frequency: $f_0$=3.410 MHz, temperature corrected; pre-set range for the 10-stage frequency correction: $\Delta f$=2 kHz; RF pulse duration: $\tau_{RF}$=130 µs; acquisition delay time: $\tau_{delay}$=175 µs; acquisition time: $\tau_{acq}$=350 µs, time between RF pulses: $\tau_{impulsuri}$=600 µs; actual waiting time before the emission of the next pulse is calculated with the formula $\tau_{wait}=\tau_{impulsuri}-\tau_{acq}-\tau_{delay}-\tau_{RF}-4$ µs; number of pulses in the scanning sequence: n=20; number of scanning sequences applied: k=100; time between sequences: $\tau_{rep} \geq T_1$, where $T_1$=13 ms. USPI requires from the interface IAP of the power amplifier AP a RF pulse power of 30 W and controls how amplification is interrupted by means of the "Mute" function so that amplification is cut periodically throughout the waiting period $\tau_{wait}$. During the period for data acquisition $\tau_{acq}$, the NQR DSP unit orders a reception window by closing the switch SW_R with a TTL signal thus allowing the response signal to be amplified in the target frequency band with the chain of amplification A1, filtering FTJ-FTS, and amplification A2, resulting in a RF reception signal which enters SPR through the DRM module where it is converted into data. The data acquired successively according to the detection sequence is averaged to reduce noise and the end result undergoes a process of quadrature demodulation with the separation of the real and imaginary DRM components. The complex demodulated signal is converted from the time domain to the frequency domain by means of the fast Fourier transform (FFT) algorithm. The signal in the frequency domain is analysed with the system of four criteria for discriminating the presence of the target substance.

The invention claimed is:

1. A mobile NQR detector for detecting potentially explosive substances, explosives and drugs which consists of a housing (15) with reduced overall dimensions with a 4-compartment partitioning (A, A', B, and C); in the first compartment (A) is a scanning coil (1) which emits the RF excitation signal and receives an NQR response signal; in the second compartment (A') are variable capacitors (CV1, CV2); in the third compartment (B) is a central processing unit (UC); in the fourth compartment (C) are means of reception and the detector power supply, in which the central processing unit (UC) connects to a storage, data processing, and interface unit (USPI) provided with a user console (IC) and with a head (CS1) for scanning explosives/drugs around the legs and a head (CS2) for scanning suspicious objects on the ground or that cannot be moved, further comprising a radio processing system (SPR) which includes a programmable RF signal generator (DDS) which transmits RF pulses to a power amplifier (AP) coupled to an interface for gain control and for the acquisition of the reflected signal level (IAP), a series-parallel tuning circuit (CA) consisting of a flat spiral ferrite-core coil (L) and two variable capacitors (CV1, CV2) driven by two stepper motors (M1, M2) which are controlled by an automatic tuning matching module (MAA) through control interfaces.

2. A mobile NQR detector according to claim 1, wherein the interface for gain control and for the acquisition of the reflected signal level (IAP) for controlling the RF amplifier (AP) is composed of a programmable circuit and a variable attenuator; the interface is controlled by a software application implemented in the storage, processing, and interface unit (USPI).

3. A mobile NQR detector according to claim 2, wherein the RF signal supplied by the power amplifier (AP) is applied to the tuning circuit (CA) through a power filter (FTS-P) and a circuit protection (CIZ).

4. A mobile NQR detector according to claims 1 and 2, wherein the central processing unit (UC) also contains a transmit-receive switch (SW_R), a low noise amplifier (A1), a chain of filters (FTJ-FTS) and an output amplifier (A2); all these elements acquire the NQR signal representing the substance response, which is brought at optimal parameters for digital conversion by means of a digital signal converter (DRM) and through processing in a control and processing unit (NQR DSP).

5. A mobile NQR detector according to claim 1, wherein the storage, data processing, and interface unit (USPI) is composed of a microprocessor-based computer system running a software application that has the following main functions:

Processing of data from the radio processing system (SPR) by using the Fast Fourier transform (FFT) basic algorithm;

analyzing the frequency spectrum based on four criteria and combining them into the logical filter (FTJ-FTS) for discriminating the presence of the target substances;

managing the substances database BD and the graphical user interface; Controlling the interface for gain control and for the acquisition of the reflected signal level (IAP) for controlling the RF amplifier;

Correcting the scanning frequency with ambient temperature by changing pulse parameters, using multiple carrier frequencies ranging between preset limits around the given temperature and a longer pulse duration;

Executing a software application which controls the scanning sequence at the radio processing system (SPR).

6. A mobile NQR detector according to claim 1, wherein said housing (15) is an enclosure for shielding against electromagnetic radiation in the 0.4-6 MHz band built on a framework of steel profiles, comprising compartment A and compartment A' which together form a unitary subassembly with walls made of several layers of different materials. From the inside to the outside the walls are made of a layer of rubber with a thickness of 3 mm, a layer of copper sheet with a thickness of 3 mm, a layer of iron sheet with a thickness of 1.5 mm positioned at a distance of 30 mm of the preceding layer, a layer of rubber with a thickness of 3 mm, a layer of conductive absorbent felt and a layer of galvanized iron sheet with a thickness of 0.3 mm.

7. A method for detecting potentially explosive substances, explosives and drugs which comprises the following steps:

measuring the ambient temperature with a sensor;

digitally converting the temperature value and reading it in a software application which controls a radio processing system (SPR);

calculating an NQR frequency by using a coefficient of variation specific to each target substance and transmitting that value (fo) to a programmable RF signal generator (DDS);

ordering, by means of the software application, RF pulses with a certain duration (TRF) during which the signal frequency will increase in 10 stages within a predetermined range Af around fo, i.e. fo±Af/2;

identifying the substance by real-time discrimination of a received signal based on a set of four combined criteria applied to a spectral response obtained by means of a Fast Fourier transform FFT.

8. A detection method according to claim 7, wherein the four criteria are related to the characteristics of the received signal, such as an amplitude and a position of the maximum spectral peak, a relative position of any secondary peaks, and an average value, requiring that the positions and amplitudes of the peaks and the average fall within numerical ranges determined depending on an amplitude of the maximum spectral peak.

9. A detection method according to claim 7, wherein the following specific values are used to detect RDX and RDX-based explosive materials:

basic NQR excitation frequency: fo=3.410 MHz, temperature corrected; preset range for the 10-stage frequency correction: Δf=2 kHz, RF pulse duration: TRF=130 ps, acquisition delay time: Tdelay=175 ps, acquisition time: $Tac_q$=350 ps, time between RF pulses: Timpulsuri=600 ps, actual waiting time before the emission of the next pulse is calculated with the formula Twait=Timputsuri−Tacq−Tdelay−TRF⁻41.1 S, number of pulses in the scanning sequence: n=20, number of scanning sequences applied: k=100; time between sequences Trep≥$T_1$, where $T_1$=13 ms.

10. A detection method according to claim 7, wherein a storage, data processing, and interface unit (USP1) requires from an interface (IAP) of the power amplifier (AP) a RF pulse power of 30 W and controls how amplification is interrupted by means of the "Mute" function so that amplification is cut periodically throughout the waiting period Twait; during the period for data acquisition Tacq, the NQR DSP control and processing unit orders a reception window by closing a switch (SW_R) with a TTL signal thus allowing the response signal to be amplified in the target frequency band with an amplification-filtering-amplification chain, resulting in a RF reception signal which enters the processing system through a digital signal converter, where it is converted into data.

11. A detection method according to claim 10, wherein the data acquired successively according to the detection sequence is averaged to reduce noise and the end result undergoes a process of quadrature demodulation with the separation of the real and imaginary components, as the complex demodulated signal is converted from the time domain to the frequency domain by means of the fast Fourier transform (FFT) algorithm and analyzed with the system of four criteria for discriminating the presence of the target substance.

* * * * *